United States Patent
Long et al.

(10) Patent No.: US 11,837,493 B2
(45) Date of Patent: Dec. 5, 2023

(54) ELECTROSTATIC CHUCK ASSEMBLY FOR PLASMA PROCESSING APPARATUS

(71) Applicants: Beijing E-Town Semiconductor Technology Co., Ltd., Beijing (CN); Mattson Technology, Inc., Fremont, CA (US)

(72) Inventors: Maolin Long, Santa Clara, CA (US); Weimin Zeng, San Jose, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 50 days.

(21) Appl. No.: 17/717,652

(22) Filed: Apr. 11, 2022

(65) Prior Publication Data

US 2023/0005778 A1 Jan. 5, 2023

(30) Foreign Application Priority Data

May 28, 2021 (CN) .......................... 202110589056.5

(51) Int. Cl.
*H01L 21/683* (2006.01)

(52) U.S. Cl.
CPC .................. *H01L 21/6833* (2013.01)

(58) Field of Classification Search
CPC ............ H01L 21/6833; H01J 37/32568; H01J 37/32715; H01J 37/32724
USPC ........................................................ 361/234
See application file for complete search history.

(56) References Cited

U.S. PATENT DOCUMENTS

| | | | |
|---|---|---|---|
| 7,394,640 B2 * | 7/2008 | Hayakawa | .......... H01L 21/6833 |
| | | | 279/128 |
| 8,441,772 B2 | 5/2013 | Yoshikawa | |
| 8,902,561 B2 | 12/2014 | Chen et al. | |
| 10,720,346 B2 * | 7/2020 | Singh | .................. H01L 21/3065 |
| 10,825,660 B2 | 11/2020 | Yamaguchi et al. | |
| 2019/0355556 A1 | 11/2019 | Takahashi | |
| 2020/0161156 A1 * | 5/2020 | Qiao | .................. H01L 21/68757 |
| 2020/0173022 A1 * | 6/2020 | Han | .................. H01J 37/32174 |

FOREIGN PATENT DOCUMENTS

CN 111383895 A 7/2020

* cited by examiner

*Primary Examiner* — Kevin J Comber
(74) *Attorney, Agent, or Firm* — Dority & Manning, P.A.

(57) ABSTRACT

An electrostatic chuck including a clamping layer having a first clamping electrode and a second clamping electrode is disclosed. A first clamping electrode defining a first clamping zone and a second clamping zone is provided. The first clamping zone and the second clamping zone are separated by a first gap and are electrically connected by at least one electrical connection extending across the first gap. A second clamping electrode disposed radially outward from the first clamping electrode. The second clamping electrode defining a third clamping zone and a fourth clamping zone that are separated by a second gap. The third clamping zone and the fourth clamping zone are electrically connected by at least one electrical connection extending across the second gap. Plasma processing apparatuses and systems incorporating the electrostatic chuck are also provided.

20 Claims, 10 Drawing Sheets

US 11,837,493 B2

ELECTROSTATIC CHUCK ASSEMBLY FOR PLASMA PROCESSING APPARATUS

PRIORITY CLAIM

The present application claims the benefit of priority of Chinese Application No. 202110589056.5, titled "Electrostatic Chuck Assembly For Plasma Processing Apparatus," filed May 28, 2021, which is incorporated herein by reference for all purposes.

FIELD

The present disclosure relates generally to a plasma processing apparatus for plasma processing of a workpiece. More specifically, the present disclosure is directed to an electrostatic chuck assembly for the plasma processing apparatus.

BACKGROUND

Various types of process chambers are available for processing different types of workpieces. The workpieces may comprise, for instance, glass plates, films, ribbons, solar panels, mirrors, liquid crystal displays, semiconductor wafers, and the like. Many different types of process chambers are available, for instance, for processing semiconductor wafers during the manufacture of integrated circuit chips. The process chambers may be used to anneal the wafers, carry out chemical vapor deposition, physical vapor deposition, plasma and chemical etching processes, thermal processes, surface engineering and other processes. These types of process chambers typically contain a workpiece support for holding the workpiece within the chamber.

In many processes, it is desirable to control certain parameters of the workpiece during processing in order to control uniformity during processing. Although various attempts have been made to design workpiece supports that can control temperature non-uniformities, various deficiencies and drawbacks remain. Accordingly, improved workpiece supports and plasma processing apparatuses and systems are needed.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
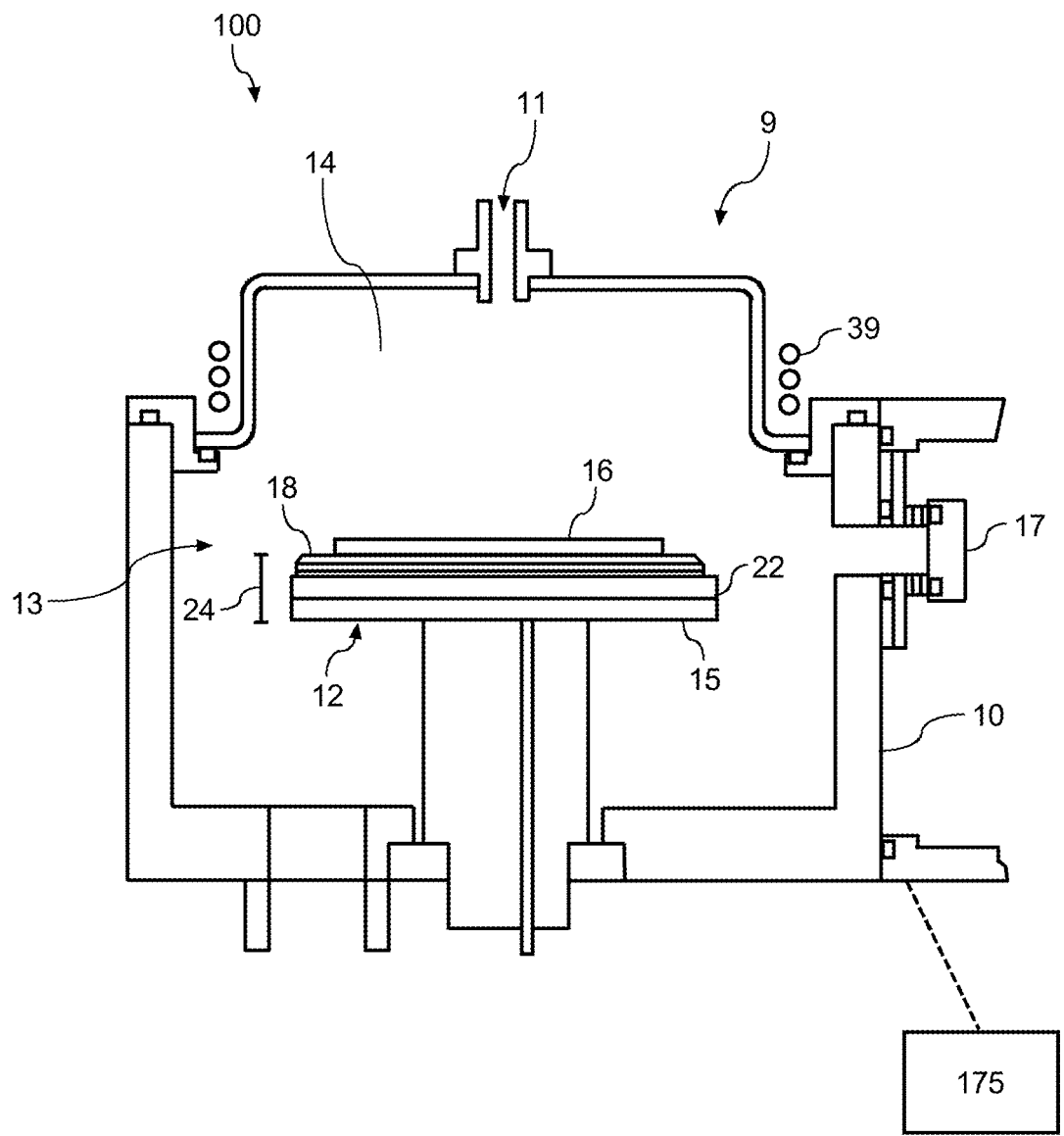
FIG. 1 depicts an example processing apparatus according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor workpiece or other suitable workpiece. In addition, the use of the term "about" in conjunction with a numerical value is intended to refer to within ten percent (10%) of the stated numerical value. A "pedestal" refers to any structure that can be used to support a workpiece. A "remote plasma" refers to a plasma generated remotely from a workpiece, such as in a plasma chamber separated from a workpiece by a separation grid. A "direct plasma" refers to a plasma that is directly exposed to a workpiece, such as a plasma generated in a processing chamber having a pedestal operable to support the workpiece.

As used herein, use of the term "about" in conjunction with a stated numerical value can include a range of values within 10% of the stated numerical value.

Conventional plasma processing apparatuses include a workpiece support that can include an electrostatic chuck. Generally, an electrostatic chuck includes one or more electrodes embedded in a ceramic puck. When the electrode is charged with electricity, differences in the electrostatic charges in the electrode and the workpiece will hold the workpiece on the workpiece support. Existing electrostatic chucks include monopolar (e.g., a single electrode) or dipolar (e.g., to electrodes) designs. However, the present inventors have discovered that electrostatic forces generated by the electrodes can create process non-uniformities on the workpiece. For example, existing bipolar electrostatic chucks can cause side-to-side etch rate non-uniformity patterns due to the layout of the electrodes, which have a clear side-to-side pattern in electric field distribution due to the connections of the electrodes to their respective power source or sources.

Accordingly, example aspects of the present disclosure provide for a unique radial layout for the chucking (e.g., clamping) electrodes. The chucking electrodes can be thermally isolated and electrically connected in a manner resulting in a total of four isolated zones in the chucking electrodes. In general, example aspects of the present disclosure are directed to an electrostatic chuck that includes a clamping layer having one or more clamping electrodes. The clamping electrodes include a first clamping electrode defining a first clamping zone and a second clamping zone. The clamping electrodes include a second clamping electrode defining a third clamping zone and a fourth clamping zone. The first clamping zone and the second clamping zone are separated by a first gap. The first clamping zone and second clamping zone are electrically connected by at least one electrical connection extending across the first gap. The third clamping zone and the fourth clamping zone are separated by a second gap. The third clamping zone and fourth clamping zone are electrically connected by at least one electrical connection extending across the second gap.

The first and second clamping electrodes are disposed in a radial manner such that the first clamping zone is radially most inward, the second clamping zone is radially inward from the third clamping zone and radially outward from the first clamping zone, and the third clamping zone is radially inward from the fourth clamping zone and radially outward from the second clamping zone. The clamping zones can correspond to the placement of one or more heating zones defined in a heating layer with heating electrodes.

Further, the electrostatic chuck can include a thermal control system. The thermal control system can include a layer disposed in the chuck in order to distribute a thermal exchange fluid or gas (e.g., helium). The thermal control system can include one or more flow channels that are interconnected to one or more release apertures disposed in certain release zones. For example, in embodiments, the release zones of apertures can be disposed in a radial pattern corresponding to the clamping zones and/or heating zones. For example, the first zone of release apertures can be located radially most inward and the second zone of release apertures can be located radially outward from the first zone of release apertures. The third zone of release apertures can be located radially outward from the second zone of release apertures and radially inward from the fourth zone of release apertures.

In certain implementations, the electrostatic chuck can also include a sealing band. The sealing band generally sits atop at least a portion of the workpiece support surface of the electrostatic chuck, more specifically the sealing band surround an outer perimeter of the electrostatic chuck. The sealing band is configured to have a width W1 that is greater than about 3 millimeters (mm) up tot about 10 mm. Sizing the sealing band according to example aspects of the present disclosure, provides a more robust sealing band that is better able to withstand processing and cleaning conditions without being damaged such that leakage of heat exchange gas likely to occur.

The electrostatic chuck according to example embodiments of the present disclosure can provide numerous benefits and technical effects. For instance, at least two clamping electrodes can be radially arranged and connected resulting in at least four thermally isolated zones. Each thermally isolated zone can be controlled in order to improve process uniformity. Additionally, electrostatic chuck bias compensation (e.g., chucking voltage offset) can be used to actively control the etch rate uniformity and/or chemical deposition on workpieces during processing. Furthermore, disposing certain heating zones and/or zones of release apertures as provided can further enhance temperature control in the radial and azimuthal directions across the workpiece. Further, sizing the sealing band as provided herein, ensures that the sealing band is more durable and is less susceptible to erosion from plasma exposure and, therefore, less likely to leak heat exchange gas around the perimeter of the workpiece.

Figure 2:
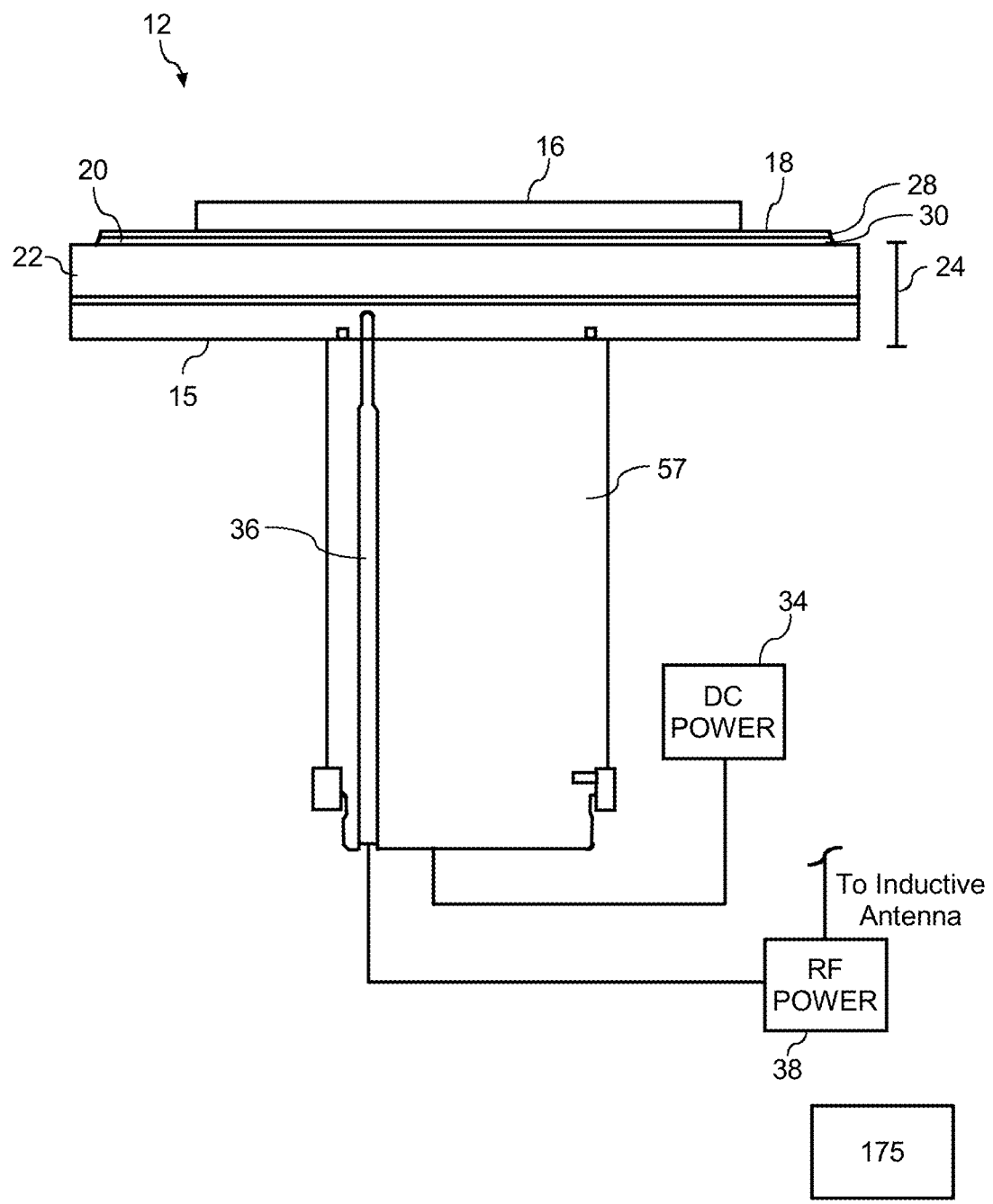
FIG. 2 depicts an example workpiece support according to example embodiments of the present disclosure.

Referring to FIGS. 1-2, for instance, one embodiment of a workpiece processing system 100 made in accordance with the present disclosure is shown. In the embodiment illustrated in FIG. 1, the system includes a process chamber 9. The process chamber 9 includes a workpiece processing station 13. The processing station 13 includes a workpiece support 12 made in accordance with the present disclosure. The process chamber shown in FIG. 1 includes one processing station 13 for processing one workpiece, such as a semiconductor wafer. It should be understood, however, that the process chamber 9 may include more than one processing station in other embodiments. As shown, the processing station 13 includes a processing region 14. The processing region 14 is in communication with an isolation valve 17. Isolation valve 17 opens and closes so as to allow the workpiece to be exchanged. The isolation valve 17 seals to the process chamber wall 10.

In the embodiment illustrated, the workpiece support 12, or at least a portion of the workpiece support, includes an electrostatic chuck 24. Electrostatic chucks 24 are configured to produce an electrostatic force that holds a workpiece 16 onto the top surface of the workpiece support 12. More particularly, the electrostatic chucks function by applying one, monopolar, or two, bipolar, high DC voltages between an electrostatic chuck and the workpiece. For instance, two, bipolar DC voltages cause both positive and negative charges on one side of the first dielectric layer 28. These charges, generate attractive Coulomb forces between the top surface of the workpiece support 12 and a workpiece 16. As will be described in greater detail below, the workpiece support 12 includes a clamping layer having one or more clamping electrodes that enables the electrostatic chuck function. It should be understood, however, that the teachings and principles of the present disclosure are also applicable to other workpiece supports that do not necessarily comprise electrostatic chucks.

The processing station 13 is configured to receive a workpiece 16 on the workpiece support 12. Once the workpiece 16, such as a semiconductor wafer, is loaded into the process chamber, the workpiece 16 is subjected to an energy source in order for the workpiece 16 to undergo a desirable physical and/or chemical change. Energy sources that may be used to process workpieces can include, for instance, an ion source, a reactive chemical source, a thermal source, a plasma source, or mixtures thereof. Thermal sources that may be used to subject the workpieces to energy include light energy sources, such as, plasma arc lamps, tungsten halogen lamps, microwave, inductive, resistive heaters, or mixtures thereof.

In certain embodiments, process chamber 10 includes a plasma source for subjecting a workpiece to a plasma. The plasma is supplied by means of one or more induction coils 39 that are in communication with a RF impedance matching device (not shown) and in communication with a RF power supply (not shown). While only one induction coil 39 is shown, the disclosure is not so limited. Indeed any number of induction coils could be provided in order to generate a plasma in the process chamber 9.

The workpiece processing system 100 of FIG. 1 is provided for purposes of illustration and discussion. Those of ordinary skill in the art, using the disclosures provided herein, will understand that the electrostatic chuck(s)

according to example aspects of the present disclosure can be used in any suitable processing system (e.g., any suitable plasma processing system).

Referring now to FIG. 2, as shown, the workpiece support 12 includes a workpiece-receiving surface 18 that is defined by a dielectric portion 20. The dielectric portion 20 is positioned on top of a base that, in this embodiment, includes a first base portion 22 positioned over a second base portion 15. In embodiments, the combination of dielectric portion 20, first base portion 22, and second base portion 15 can be referred to as the electrostatic chuck 24. The electrostatic chuck 24, and representative layers, is made from any suitable metallic or ceramic material. For instance, in one embodiment, the base portions 22 and 15 can be made from aluminum. The electrostatic chuck 24 can also include alumina, aluminum nitride, yttria, zirconia, and/or any other chemically resistant ceramic or plastic material. The electrostatic chuck 24 is attached to a workpiece support pedestal 57. The purpose of the pedestal 57 is to provide rigid mechanical support for the electrostatic chuck 24 and to provide both thermal and electrical isolation from the process chamber 9.

As described above, the dielectric portion 20 is positioned on top of the first base portion 22 and defines the workpiece-receiving surface 18. The dielectric portion 20 can be made from any suitable dielectric material, such as a ceramic material. The dielectric portion can comprise multiple layers of a dielectric material or can comprise a single layer. In the embodiment the dielectric portion 20 includes a first dielectric layer 28 positioned on top of a second and thicker second dielectric layer 30. The first dielectric layer 28, for instance, can have a thickness of about 0.4 to about 1 mm, while the second dielectric layer 30 can have a thickness of from about 2 mm to about 5 mm.

As shown in FIG. 2, the workpiece support 12 can further be in communication with an RF conduit 36 that is in communication with an RF impedance matching device (not shown) in communication with an RF power supply 38 for supplying an RF bias power to the workpiece.

In an alternative embodiment, the RF source power can be coupled to the workpiece support 12 through an RF impedance matching device (not shown) that is in communication with a RF conduit 36. In this embodiment, there is no additional RF power supplied to the processing station 13. In an alternative embodiment, no RF source power is coupled to the workpiece support 12. During workpiece processing, the RF power source can be energized to produce ions and electrons in the plasma for desired chemical reactions with a top surface of the workpiece 16. In other embodiments, the RF power source provides independent control of the energy that ions have when they strike the top surface of the workpiece. The RF power supply and the DC power supply can both be grounded using any suitable technique. In one embodiment, for instance, both RF and DC power supplies may be grounded to an electrode in communication with the processing chamber. In the embodiments illustrated, the process chamber employs inductive-coupled RF power to generate and maintain a plasma necessary for workpiece processing. The RF bias power is capacitively coupled to the plasma through the workpiece support 12.

In order to load and unload workpieces on the workpiece-receiving surface 18, the workpiece support 12 can include any suitable mounting device. For instance, in one embodiment, the workpiece support 12 may include a plurality of lift pins (not shown) that can be used to properly position a workpiece 16 on the workpiece-receiving surface 18 and to elevate and lower the workpiece 16 on the workpiece-receiving surface. In this regard, the workpiece support 12 can include a plurality of pin channels for a lift pin assembly. In one embodiment, for instance, the workpiece support 12 may include three pin channels for accommodating three pins.

In embodiments, the workpiece processing system 100 can include a controller 175. The controller 175 controls various components in processing chamber 9 to direct processing of workpiece 16. For example, controller 175 can be used to control power sources (e.g., DC power source, AC power source, and/or RF power source) connected to the electrodes in the clamping layer 40 and/or heating layer 50. Additionally and/or alternatively, controller 175 can be used to control the thermal management system 70 in order to control or maintain a desired workpiece temperatures. The controller 175 can also implement one or more process parameters, such as controlling the gas flow controllers and/or altering conditions of the processing chamber 9 during processing of the workpiece 16. The controller 175 can include, for instance, one or more processors and/or one or more memory devices. The one or more memory devices can store computer-readable instructions that, when executed by the one or more processors, cause the one or more processors to perform operations, such as any of the control operations described herein.

Figure 3:
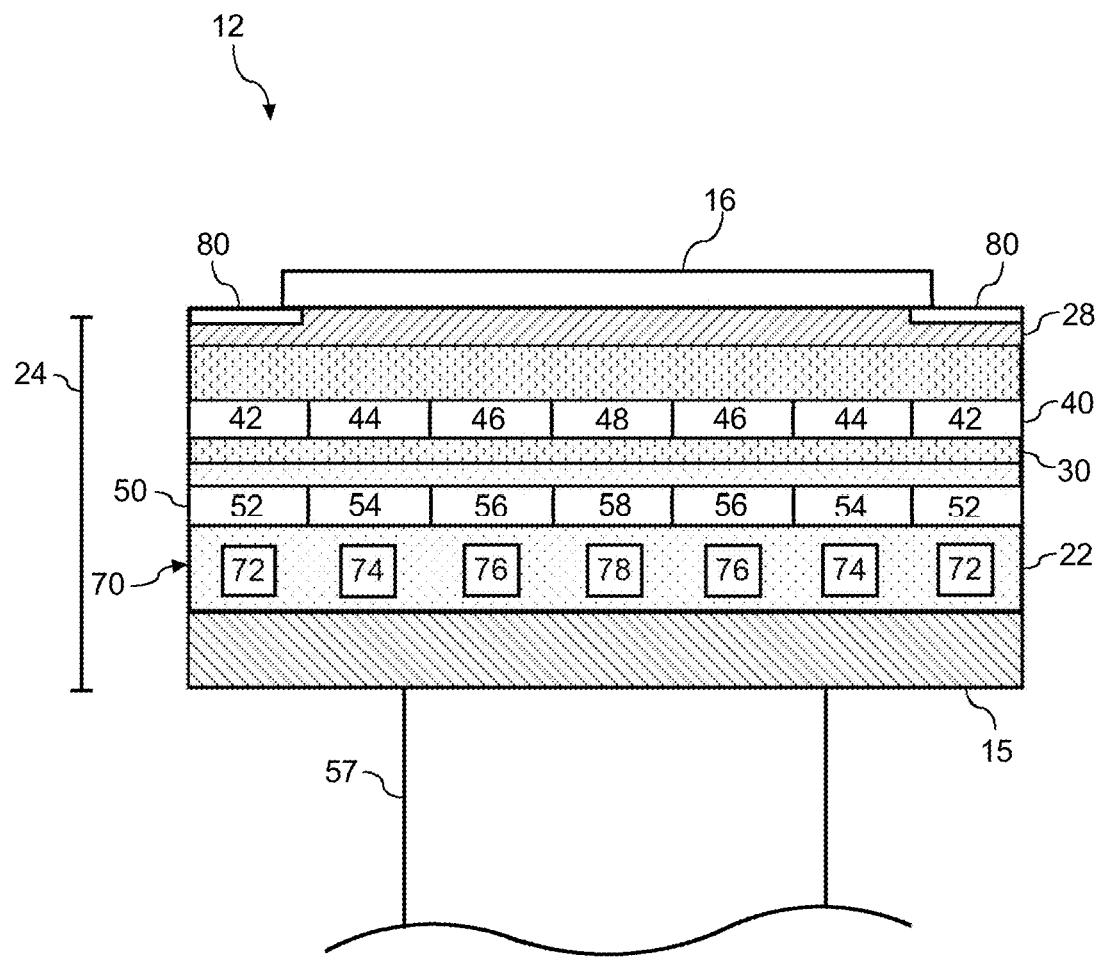
FIG. 3 depicts an example workpiece support according to example embodiments of the present disclosure.

Referring now to FIG. 3, the electrostatic chuck 24 portion of the workpiece support 12 is shown. As shown, a workpiece 16 is placed on the workpiece-receiving surface 18. A sealing band 80 is disposed around a perimeter of the electrostatic chuck 24 and is disposed on at least a portion of the workpiece-receiving surface 18. The sealing band 80 will be further discussed herein. A clamping layer 40 is disposed between the first dielectric layer 28 and the second dielectric layer 30. The clamping layer 40 can include one or more clamping zones 42, 44, 46, 48, which will be discussed further herein. A heating layer 50 is disposed underneath of the clamping layer 40 in the z-direction. The heating layer 52 can be disposed within the second dielectric layer 30 or between the second dielectric layer 30 and the first base portion 22. The heating layer includes one or more heating zones 52, 54, 56, 58, which will be discussed further herein. A thermal control system 70 is disposed in the electrostatic chuck 24. The thermal control system 70 can be disposed within the second dielectric layer 30 or the first base portion 22. The Similar to the clamping layer 40 and the heating layer 50, the thermal control system 70 includes one or more zones 72, 74, 76, 78 of release apertures 73 for releasing a heat exchange fluid or gas in order to control the temperature of the workpiece 16. The thermal control system 70 will be discussed further herein.

Figure 4:
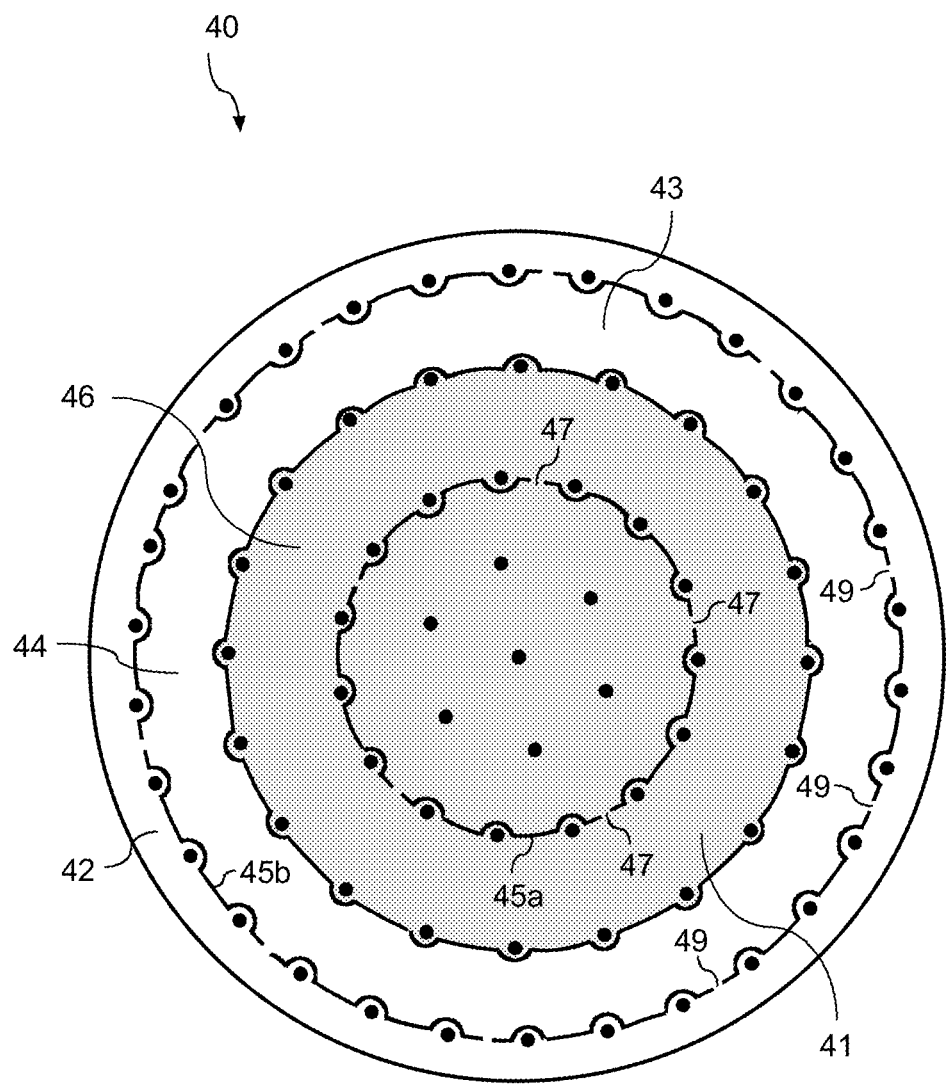
FIG. 4 depicts a top down view of a clamping layer having two clamping electrodes according to example embodiments of the present disclosure.

As shown in FIGS. 3 and 4, in one embodiment in order to form the electrostatic chuck 24, a clamping layer 40, including one or more clamping electrodes, can be positioned within the electrostatic chuck 24. For example, in embodiments, the clamping layer 40 can be positioned between the first dielectric layer 28 and the second dielectric layer 30. The one or more clamping electrodes present in the clamping layer 40 can be placed in communication with a DC power supply 34 as shown in FIG. 2. Two different DC voltages can be supplied by a single DC power supply or by two independent power supplies. The DC power supply 34 supplies the voltages necessary to create an electric field for producing electrostatic attraction between the workpiece-receiving surface 18 and a workpiece 16 held on the surface. The amount of voltage created by the DC power supply can be used to adjust the amount of electrostatic attraction. Further, when it is necessary to remove the workpiece 16 from the workpiece support 12, the DC power supply can be turned off so that no voltage is being produced or can create a reverse polarity voltage from the starting potential. DC voltages typically vary from about 500 to 2000 volts.

As shown in FIG. 4, the clamping layer 40 can include one or more electrodes, such as at least two electrodes 41, 43, disposed in radial arrangement. The first clamping electrode 41 can be coupled to a negative charge source, while the second clamping electrode 43 can be coupled to a positive charge source. In other embodiments, however, it is contemplated that either the first or second clamping electrode 41, 43 could be coupled to either a positive or a negative charge source. For example, in embodiments, the first clamping electrode 41 is coupled to a negative DC voltage and the second clamping electrode 43 is coupled to a positive DC voltage. Furthermore, the first clamping electrode 41 and the second clamping electrode 43 can be coupled to a DC power source, AC power source, and/or a RF power source. In embodiments, both the first clamping electrode 41 and the second clamping electrode 43 can be coupled to the same RF power source.

Furthermore, as shown in FIG. 4, the clamping layer 40 includes a first clamping electrode 41 and a second clamping electrode 43 disposed in radial arrangement. That is, the first clamping electrode 41 is disposed radially inward from the second clamping electrode 43. The first clamping electrode 41 defines a first clamping zone 48 and a second clamping zone 46. The second clamping electrode 43 defines a third clamping zone 44 and a fourth clamping zone 42. As shown, the first clamping zone 48 is disposed radially most inward. The second clamping zone 46 is disposed radially outward from the first clamping zone 48 and radially inward from the third clamping zone 44. The fourth clamping zone 42 is disposed radially most outward.

Each of the clamping zones 42, 44, 46, and 48 can be thermally isolated from one another. For example, the first clamping zone 48 and the second clamping zone 46 can be separated by a gap 45*a*. The third clamping zone 44 and the fourth clamping zone 42 can also be separated by a gap 45*b*. Furthermore, gap 45*a* reduces thermal conduction between the first clamping zone 48 and the second clamping zone 46 and the second gap 45*b* reduces thermal conduction between the third clamping zone 44 and the fourth clamping zone 42. The gaps 45*a*, 45*b* can include an air gap or can comprise any suitable material. For example, in certain embodiments, the gaps 45*a*, 45*b* comprise a dielectric material (e.g., ceramic material).

One or more electrical connections 47 can be used to couple first clamping zone 48 with the second clamping zone 46. For example, a plurality of electrical connections 47 can be used, such as at least five electrical connections 47. Similarly, one or more electrical connections 49 can be used to couple the third clamping zone 44 to the fourth clamping zone 42. The number of electrical connections 49 can include more than 1, such as more than 5, such as more than 10. In certain embodiments, the number of electrical connections 47 connecting the first and second clamping zones 48, 46 can be less than the number of electrical connections 49 connecting the third and fourth clamping zones 44, 42.

While each of the two clamping electrodes 41 and 43 are thermally isolated into two zones each, they are connected via the electrical connection 47 or 49 in order to keep them at approximately the same electrical potential. For example, in embodiments, the first clamping zone 48 and second clamping zone 46 carry the same chucking voltage for the positive pole, while the third clamping zone 44 and fourth clamping zone 42 carry the same chucking voltage for the negative pole. Generally, the offset between the positive chucking voltage and the negative chucking voltage can either target balancing the clamping forces in order to compensate for a self-DC bias on the workpiece or can be purposely operated in an unbalanced mode for uniformity tuning purposes. For example, a workpiece can be processed and the uniformity of the workpiece can be assessed. Upon assessment if uniformity is at issue, the electrostatic chuck bias can be adjusted in order to adjust workpiece uniformity for workpieces processed in the future. For example, the clamping voltage of either the first clamping electrode 41 or the second clamping electrode 43 can be adjusted in order to adjust workpiece uniformity.

Furthermore, as noted, the clamping electrodes 41 and 43 can be connected to any suitable power source or voltage source (e.g., a DC power source or an RF power source). In certain embodiments, the clamping electrodes 41, 43 are coupled to a voltage source (e.g., a high DC voltage source) the voltage source is configured to provide a DC offset ad adjustment to balance one or more clamping forces or to adjust workpiece processing uniformity. In certain configurations, the clamping electrodes are coupled to a bipolar high voltage supply (e.g., a bipolar high DC voltage supply). In certain configurations, each of the clamping zones 42, 44, 46, and/or 48 can be operated independently from each other in order to adjust workpiece uniformity. For instance, in embodiments, a different amount of power output and/or a different power source itself can be applied to any of the clamping zones 42, 44, 46, and 48 in order to adjust workpiece uniformity. For example, a different amount of DC voltage, RF power output, and/or a different power source can be applied to any of the clamping zones 42, 44, 46, 48 in order to adjust workpiece uniformity. For example, in certain embodiments, application of different amounts of DC voltage and/or RF power applied across the clamping zones 42, 44, 46, 48 can modify the clamping electrodes 41, 43 so as to provide a tri-polar or quadra-polar electrostatic chuck. Furthermore, the clamping electrodes can be connected to a DC power source or an RF power source with one or more capacitors disposed along the RF path in order to prevent DC voltage from interfering with or accessing the RF delivery. Additionally or alternatively, an inductor and/or resistor in series can be disposed in the DC path to prevent RF voltage from accessing the DC voltage supply.

Additionally, one or more traces can be utilized in order to arrange the clamping zones 42, 44, 46, 48 in any type of electrical configuration. For example, the first clamping zone 48 and the third clamping zone 44, could be electrically coupled to one or more traces embedded in a layer of the electrostatic chuck 24 to form the first clamping electrode 41 and the second clamping zone 46 and the fourth clamping zone 42 could be electrically coupled to one or more traces embedded in a layer of the electrostatic chuck 24 to form the second clamping electrode 43. Moreover, in embodiments, the first clamping zone 48 and the fourth clamping zone 42 could be electrically coupled to one or more traces embedded in a layer of the electrostatic chuck 24 to form the first clamping electrode 41 and the second clamping zone 46 and third clamping zone 44 could be electrically coupled to one or more traces embedded in a layer of the electrostatic chuck 24 to form the second clamping electrode 43. In such embodiments, the traces used to connect different clamping zones 42, 44, 46, 48 can be located generally in a layer of the electrostatic chuck that is underneath of the clamping layer 40. Once the selected clamping zones are coupled via a trace, the trace can then be connected to any suitable power source as described herein.

Figure 5:
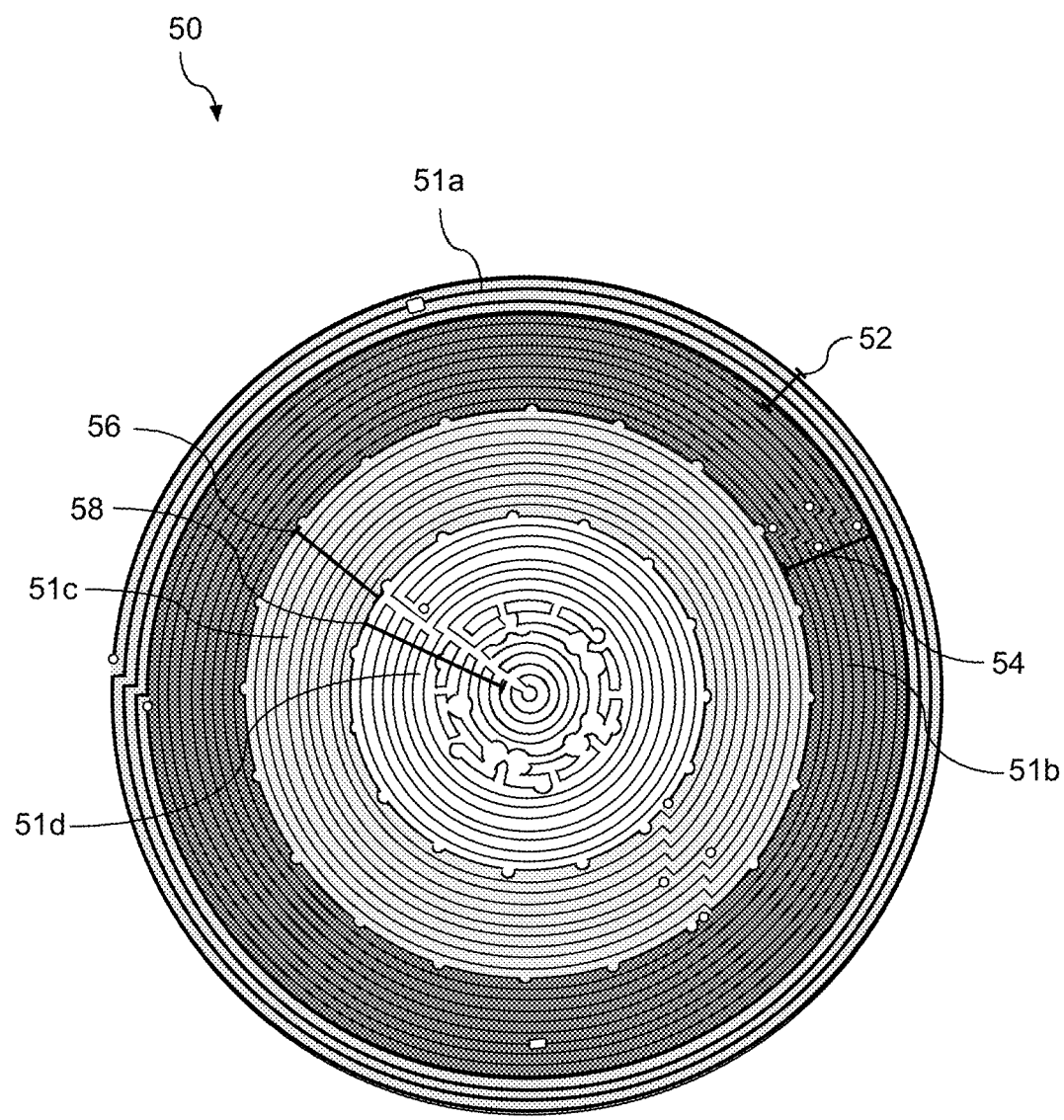
FIG. 5 depicts a top down view of a heating layer having one or more heating electrodes according to example embodiments of the present disclosure.

In one or more embodiments, a heating layer 50 can be disposed in the workpiece support 12. For example, FIG. 5 illustrates different zones of the heating layer 50. For example, the heating layer 50 can include one or more electrodes 51, such as a plurality of electrodes 51a, 51b, 51c, 51d arranged in a radial pattern. For example, in certain embodiments, the heating layer 50 includes at least four electrodes 51a, 51b, 51c, 51d. Each of the electrodes 51a, 51b, 51c, 51d can be connected to a suitable AC or DC power source. In certain embodiments, the plurality of heating electrodes 51a, 51b, 51c, 51d are disposed in a radial manner to form a first heating zone 58, a second heating zone 56, a third heating zone 54, and a fourth heating zone 52 as shown in FIG. 5. The heating zones 52, 54, 56, and 58 can be disposed in any manner on or within the heating layer 50 in the electrostatic chuck 24.

In certain embodiments, the heating zones 52, 54, 56, and 58 correspond to the clamping zones 42, 44, 46, and 48 present in the clamping layer 40. For example, as shown in FIG. 3, the first heating zone 52 is disposed under the first clamping zone 42 in the z-direction. The second heating zone 56 is disposed under the second clamping zone 46 in the z-direction. The third heating zone 54 is disposed under the third clamping zone 44 in the z-direction. The fourth heating zone 52 is disposed under the fourth clamping zone 42 in the z-direction. Additionally, the widths of the heating zones 52, 54, 56, 58 are substantially the same as the widths of the clamping zones 42, 44, 46, 48. For example, the width of the first heating zone 58 is substantially the same as the width of the first clamping zone 48. The width of the second heating zone 56 is substantially the same as the width of the second clamping zone 46. The width of the third heating zone 54 is substantially the same as the width of the third clamping zone 44. The width of the fourth heating zone 52 is substantially the same as the width of the fourth clamping zone 42. Disposition of the heating zones 52, 54, 56, 58 in relation to the clamping zones 42, 44, 46, 48 can help with thermal isolation from zone to zone radially. Furthermore, each heating zone 52, 54, 56, 58 overlaps with its corresponding clamping zone 42, 44, 46, 48 to help with thermal transition from zone to zone radially.

Each of the heating zones 52, 54, 56, 58 can be independently controlled in order to adjust heating across different radial regions of the workpiece during processing. For example, each heating zone 52, 54, 56, 58 can be formed from at least one electrode, each individual electrode (e.g., 51a, 51b, 51c, 51d) used to form the separate heating zones 52, 54, 56, 58 can be independently connected to a power source. Accordingly, different amounts and/or types of power can be supplied to each electrode in order to adjust the temperature for each of the heating zones 52, 54, 56, 58.

Figure 6:
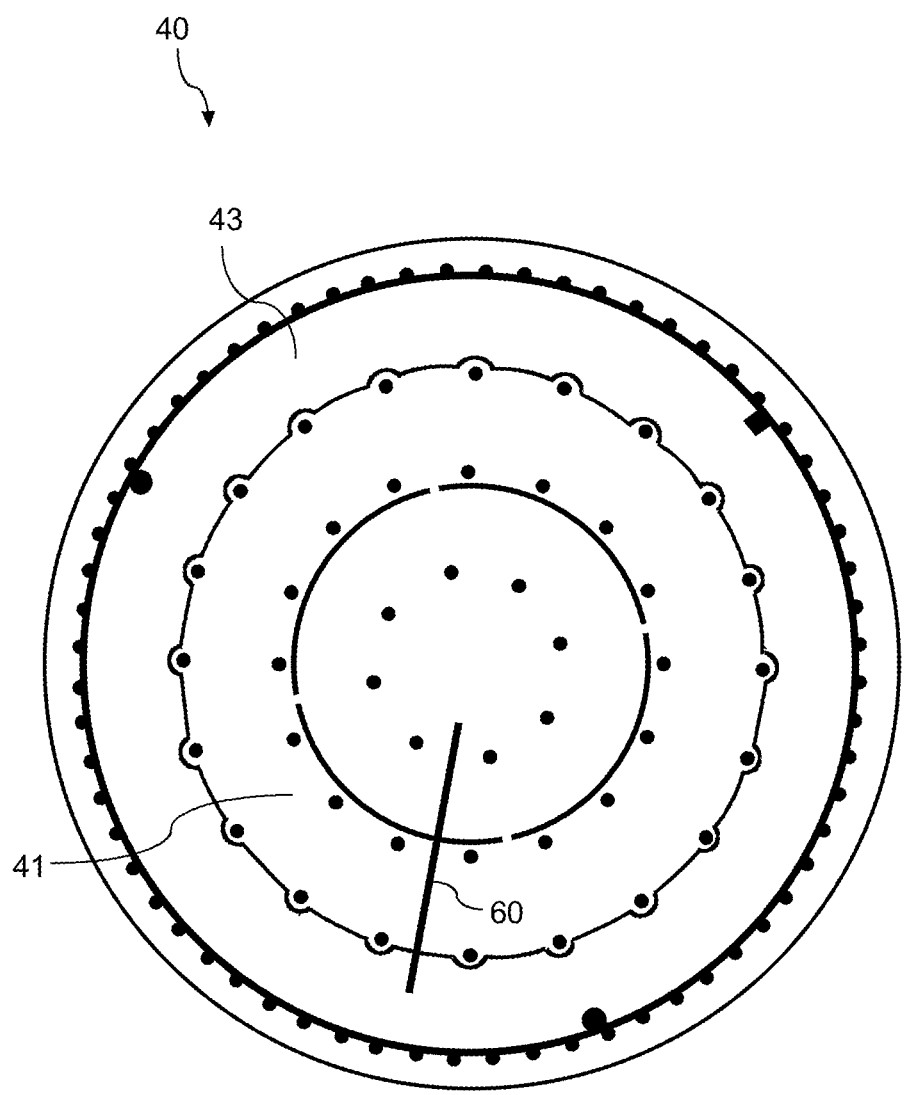
FIG. 6 depicts a bottom view of a clamping layer and a trace connection according to example embodiments of the present disclosure.
Figure 7:
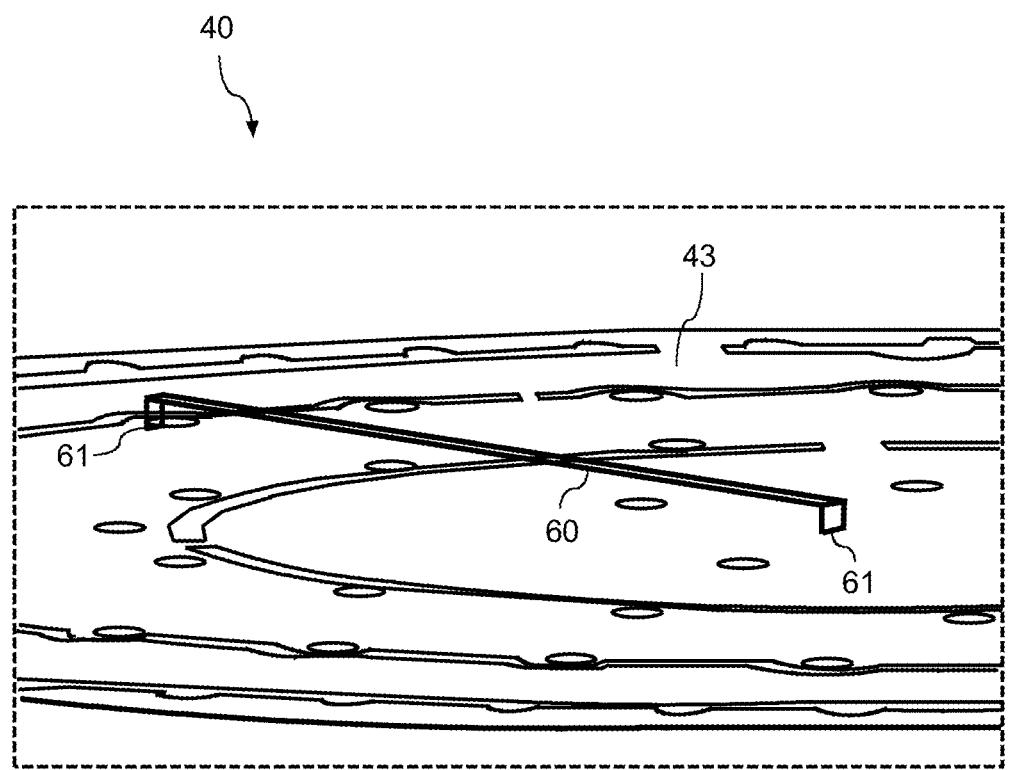
FIG. 7 depicts a bottom view of a clamping layer and a trace connection according to example embodiments of the present disclosure.
Figure 8:
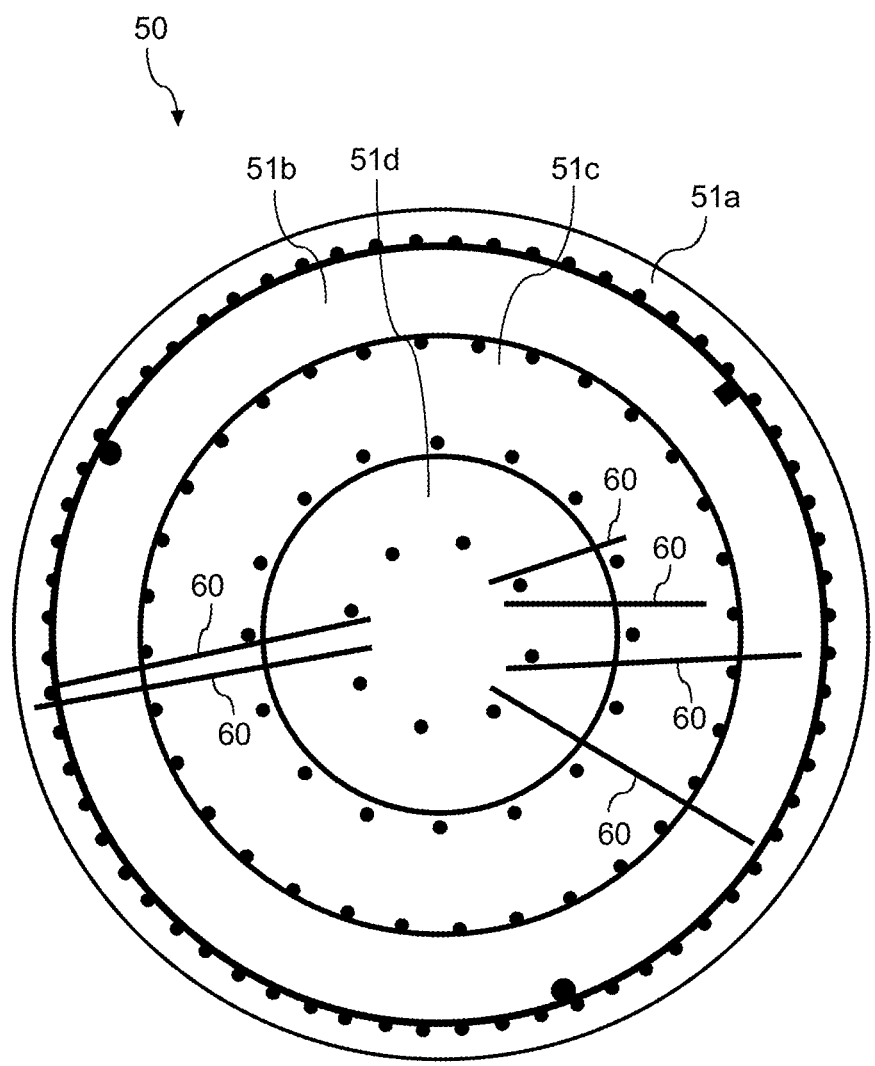
FIG. 8 depicts a bottom view of a clamping layer and a trace connection according to example embodiments of the present disclosure.

In order to connect each of the electrodes (e.g., clamping electrodes and/or heating electrodes) present in the electrostatic chuck to the appropriate or desired power source, one or more traces and/or vias can be used to connect the electrodes to the power sources. Referring to FIGS. 6-8, for example, in certain embodiments a trace 60 is used to connect the second clamping electrode 43 to a suitable power source. For instance, the trace 60 can run from the second electrode 43 towards the center of the clamping layer 40. In certain embodiments, the trace 60 is run in a layer located underneath of the clamping electrodes 41, 43 towards a centrally-located delivery socket location(s) in order to couple the second clamping electrode 43 to a suitable power source. Furthermore, in embodiments, one or more vias 61 can be used to connect the trace 60 to the second electrode 43 and to the delivery socket location. Vias 61 can be used in order to run the trace 60 in a layer underneath of the clamping layer 40, that is the trace 60 is not located in the same plane orthogonal to the z-direction as the clamping layer 40. Similarly, one or more traces 60 can be run from each of the heating electrodes (e.g., 51a, 51b, 51c, 51d) towards centrally-located delivery socket locations in order to couple the heating electrodes to a suitable power source. Similar to the clamping electrode arrangement, one or more vias can be used in order to run the traces 60 underneath of the heating layer 50, that is the trace 60 (or traces) used to connect the heating electrodes to the power source(s) is not located in the same plane orthogonal to the z-direction as the heating layer 50.

In certain embodiments, the workpiece support 12 can further include a thermal control system 70. The thermal control system 70 can include one or more channels 71 for circulating a thermal exchange fluid or a thermal exchange gas (e.g., helium). The thermal control system 70 can be included as a layer disposed within the electrostatic chuck. For example, in certain embodiments the thermal control system 70 layer can be located underneath of the workpiece 16 when the workpiece is disposed on the workpiece support 12. For example, in certain embodiments the thermal control system 70 can be disposed between the workpiece 16 and the clamping layer 40. In certain other embodiments, however, it is contemplated that the thermal control system 70 could be located between the clamping layer 40 and the heating layer 50 or underneath of the heating layer 50. The thermal control system 70 can be disposed within the electrostatic chuck in any manner suitable for processing of workpieces 16 in the processing chamber. Referring back to FIG. 3, the thermal control system 70 is disposed underneath of both the clamping layer 40 and the heating layer 50 in the z-direction.

Figure 9:
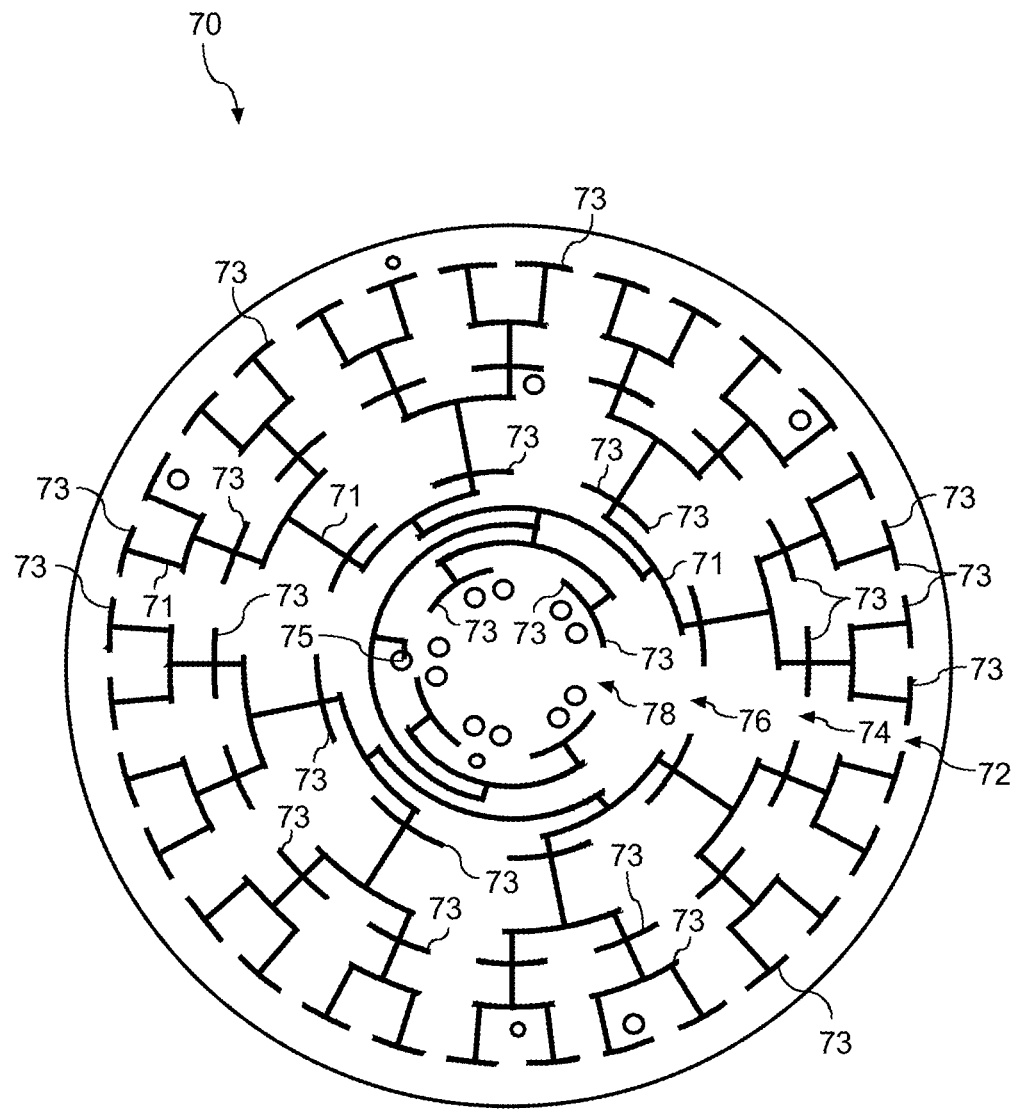
FIG. 9 depicts a top down view of a thermal control system according to example embodiments of the present disclosure.

As shown in FIG. 9, the thermal control system 70 includes one or more channels 71 and also includes one or more release apertures 73. The one or more channels 71 are interconnected via a pattern to each of the release apertures 73. The release apertures 73 are organized according to zones 72, 74, 76, 78 of release apertures 73. A single thermal exchange fluid or thermal exchange gas inlet 75 is shown. For example, in embodiments, the thermal control system 70 includes a first zone 78 of release apertures 73, a second zone 76 of release apertures 73, a third zone 74 of release apertures 73, and a fourth zone 72 of release apertures 73. The first zone 78 of release apertures 73 is disposed radially most inward. The second zone 76 of release apertures 73 is disposed radially outward from the first zone 78 of release apertures 73 and radially inward from the third zone 74 of release apertures 73. The third zone 74 of release apertures 73 is disposed radially inward from the fourth zone 72 of release apertures 73 and radially outward from the second zone 76 of release apertures 73. While at least four zones (e.g., 72, 74, 76, 78) of release apertures 73 are shown, the disclosure is not so limited. Indeed, any number of zones of release apertures could be configured into the thermal control system 70 disclosed herein. Further, the first zone 78 of release apertures 73 includes the fewest number of release apertures 73 as compared to the other zones 72, 74, 76. The second zone 76 of release apertures 73 includes more release apertures 73 than the first zone 78 of release apertures 73 but fewer release apertures 73 as compared to the third zone 74 of release apertures 73. The third zone 74 of release apertures 73 includes more release apertures 73 than the second zone 76 of release apertures 73 but fewer release apertures 73 as compared to the fourth zone 72 of release apertures 73. The fourth zone 72 of release apertures 73 includes the most release apertures 73 as compared to the other zones 74, 76, 78.

In embodiments, each of the zones 72, 74, 76, 78 of release apertures 73 generally correspond to the one or more heating zones 52, 54, 56, 58 and/or clamping zones 42, 44, 46, 48, respectively. Namely, the zones 72, 74, 76, 78 of release apertures 73 can be disposed underneath or on top of the corresponding zones of the clamping layer 40 and the heating layer 50. Such disposition is illustrated in FIG. 3. In certain embodiments, the zones 72, 74, 76, 78 of release apertures can be disposed in a layer located underneath of both the clamping layer 40 and the heating layer 50. Accordingly, one or more heat exchange conduits can be drilled through the workpiece-receiving surface 18, the clamping layer 40, and the heating layer 50, so that the thermal exchange fluid or gas released from the release apertures 73 located in each of the zones 72, 74, 76, 78 can come into contact with a backside of the workpiece 16 in order to adjust the temperature of the workpiece 16. In other embodiments, however, the thermal control system 70 can be located directly underneath of the workpiece 16 when it is held on the workpiece support 12. For instance, the zones 72, 74, 76, 78 of release apertures 73 can be located within or just below the first dielectric layer 28. In embodiments, one or more conduits can be drilled through the only the first dielectric layer 28 so that the heat exchange gas or heat exchange fluid released from the release apertures 73 located in each of the zones 72, 74, 76, 78 can come into contact with a backside of the workpiece 16 in order to adjust the temperature of the workpiece 16.

Figure 10:
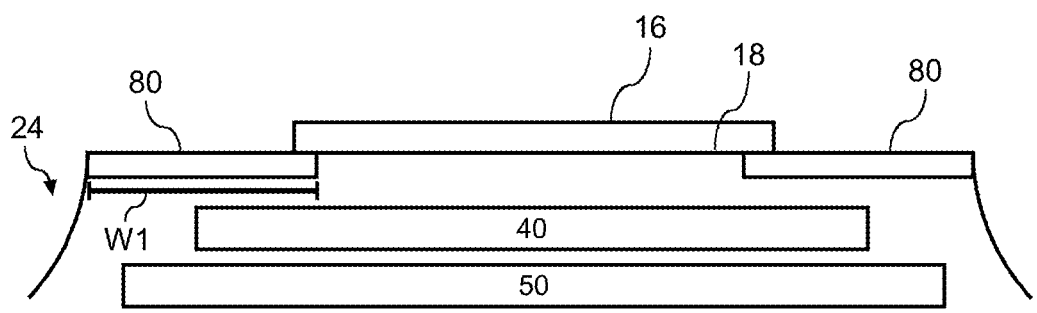
FIG. 10 depicts a portion of a workpiece support according to example embodiments of the present disclosure.

Referring now to FIG. 10, in certain embodiments, (e.g., those including a thermal control system capable of helium distribution), the electrostatic chuck 24 can include a sealing band 80. The sealing band 80 generally surrounds an outer perimeter of the electrostatic chuck 24 including at least a portion of the workpiece-receiving surface 18. The sealing band 80 is configured to have a width W1 that is greater than about 3 millimeters (mm) up to about 10 mm, such as greater than 4 mm up to about 9 mm, such as greater than 5 mm up to about 8 mm, such as greater than 5 mm, up to about 7 mm. The sealing band 80 generally sits atop the electrostatic chuck 24 in order to seal any thermal exchange fluid and/or gas (e.g., helium) underneath the workpiece 16 when the workpiece 16 is chucked on to the electrostatic chuck 24. Further, electrostatic chucks often go through in-situ drycleaning (ISD) and can further go through off-situ cleaning during maintenance. If the sealing band is damaged or worn after hours of use or during cleaning, such damage can cause leakage of thermal exchange gas (e.g., helium) such that the workpiece temperature is not maintained as it should be. Further, if thermal exchange gas (e.g., helium) is able to seep out and around the sealing band such that it has access to the top of the workpiece during process, this can cause further uniformity issues during workpiece processing. Accordingly, the width W1 of the sealing band 80 provided herein is such that the sealing band 80 is more robust and is better able to withstand processing and cleaning conditions without being damaged such that leakage of thermal exchange gas is not likely to occur.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. An electrostatic chuck, comprising:
   a workpiece support surface configured to support a workpiece during processing; and
   a clamping layer including one or more clamping electrodes, the clamping layer including:
      a first clamping electrode defining a first clamping zone and a second clamping zone, the first clamping zone and the second clamping zone being separated by a first gap, the first clamping zone and the second clamping zone being electrically connected by at least one electrical connection extending across the first gap; and
      a second clamping electrode disposed radially outward from the first clamping electrode, the second clamping electrode defining a third clamping zone and a fourth clamping zone, the third clamping zone and the fourth clamping zone being separated by a second gap, the third clamping zone and the fourth clamping zone being electrically connected by at least one electrical connection extending across the second gap.

2. The electrostatic chuck of claim 1, wherein the first gap reduces thermal conduction between the first clamping zone and the second clamping zone, and wherein the second gap reduces thermal conduction between the third clamping zone and the fourth clamping zone.

3. The electrostatic chuck of claim 1, wherein the first gap and/or the second gap comprises a ceramic material.

4. The electrostatic chuck of claim 1, wherein the first electrode and the second electrode are coupled to a voltage source, the voltage source configured to provide a DC offset adjustment to balance a clamping force or to adjust workpiece processing uniformity.

5. The electrostatic chuck of claim 1, wherein the first clamping electrode and the second clamping electrode are connected to a DC power source, AC power source, and/or an RF power source.

6. The electrostatic chuck of claim 5, wherein the first clamping electrode and second clamping electrode are connected to a same RF power source.

7. The electrostatic chuck of claim 1, wherein the first clamping electrode is coupled to a negative DC voltage, and wherein the second clamping electrode is coupled to a positive DC voltage.

8. The electrostatic chuck of claim 1, wherein the first clamping zone is disposed radially most inward, wherein the second clamping zone is disposed radial outward from the first clamping zone and radially inward from the third clamping zone, and wherein the third clamping zone is disposed radially outward from the second clamping zone and radially inward from the fourth clamping zone.

9. The electrostatic chuck of claim 1, wherein a different amount of DC voltage, different amount of RF power output, and/or a different power source can be applied to the first clamping zone, the second clamping zone, the third clamping zone, and/or the fourth clamping zone to adjust the workpiece uniformity.

10. The electrostatic chuck of claim 1, further comprising a plurality of heating electrodes defining a heating layer, wherein the heating electrodes are disposed in a radial manner to form a first heating zone, a second heating zone, a third heating zone, and a fourth heating zone.

11. The workpiece support of claim 10, wherein the heating layer is disposed under the clamping layer in a z-direction, further wherein the first heating zone is disposed underneath the first clamping zone in the z-direction, the second heating zone is disposed underneath the second clamping zone in the z-direction, the third heating zone is disposed underneath the third clamping zone in the z-direction, and the fourth heating zone is disposed underneath the fourth clamping zone in the z-direction.

12. A workpiece processing apparatus, comprising:
a processing chamber; and
a workpiece support disposed in the processing chamber, the workpiece support comprising:
an electrostatic chuck including a workpiece support surface configured to support a workpiece during processing and a clamping layer including one or more clamping electrodes, the clamping layer including:
a first clamping electrode defining a first clamping zone and a second clamping zone, the first clamping zone and the second clamping zone being separated by a first gap, the first clamping zone and the second clamping zone being electrically connected by at least one electrical connection extending across the first gap; and
a second clamping electrode disposed radially outward from the first clamping electrode, the second clamping electrode defining a third clamping zone and a fourth clamping zone, the third clamping zone and the fourth clamping zone being separated by a second gap, the third clamping zone and the fourth clamping zone being electrically connected by at least one electrical connection extending across the second gap;
wherein the first gap reduces thermal conduction between the first clamping zone and the second clamping zone, and wherein the second gap reduces thermal conduction between the third clamping zone and the fourth clamping zone.

13. The workpiece processing apparatus of claim 12, comprising an inductively coupled plasma source capable of generating a plasma in the processing chamber from one or more process gases.

14. The workpiece processing apparatus of claim 12, comprising one or more heat sources capable of performing a heat treatment on the workpiece.

15. The workpiece processing apparatus of claim 12, wherein a negative DC voltage is applied to the first clamping electrode, and wherein a positive DC voltage is applied to the second clamping electrode.

16. The workpiece processing apparatus of claim 12, wherein the first clamping zone is disposed radially most inward, wherein the second clamping zone is disposed radial outward from the first clamping zone and radially inward from the third clamping zone, and wherein the third clamping zone is disposed radially outward from the second clamping zone and radially inward from the fourth clamping zone.

17. The workpiece processing apparatus of claim 12, wherein a different amount DC voltage, RF power output, and/or a different power source can be applied to the first clamping zone, second clamping zone, third clamping zone, and/or fourth clamping zone in order to adjust the workpiece uniformity.

18. The workpiece processing apparatus of claim 12, further comprising a plurality of heating electrodes forming a heating layer disposed under the clamping layer in the z-direction, wherein the heating electrodes are disposed in a radial manner to form a first heating zone, a second heating zone, a third heating zone, and a fourth heating zone.

19. The workpiece processing apparatus of claim 18, wherein the first heating zone is disposed underneath the first clamping zone in the z-direction, the second heating zone is disposed underneath the second clamping zone in the z-direction, the third heating zone is disposed underneath the third clamping zone in the z-direction, and the fourth heating zone is disposed underneath the fourth clamping zone in the z-direction.

20. A system for processing workpiece, the system comprising:
a processing chamber, the processing chamber configured to perform at least one treatment process on a workpiece;
a workpiece support disposed in the processing chamber, the workpiece support including an electrostatic chuck, the electrostatic chuck including:
a workpiece support surface configured to support the workpiece during processing;
a clamping layer comprising one or more clamping electrodes, the clamping layer including:
a first clamping electrode defining a first clamping zone and a second clamping zone, the first clamping zone and the second clamping zone being separated by a first gap, the first clamping zone and the second clamping zone being electrically connected by at least one electrical connection extending across the first gap; and
a second clamping electrode disposed radially outward from the first clamping electrode, the second clamping electrode defining a third clamping zone and a fourth clamping zone, the third clamping zone and the fourth clamping zone being separated by a second gap, the third clamping zone and the fourth clamping zone being electrically connected by at least one electrical connection extending across the second gap;
wherein the first gap reduces thermal conduction between the first clamping zone and the second clamping zone, and wherein the second gap reduces thermal conduction between the third clamping zone and the fourth clamping zone; and
one or more power voltage sources coupled to the one or more clamping electrodes, the voltage sources configured to provide a DC offset adjustment to balance a clamping force or to adjust workpiece processing uniformity; and
a controller, the controller configured to adjust a power output or a power voltage source from the one or more power voltage sources to the one or more clamping electrodes.

* * * * *